US010014197B2

(12) United States Patent
Terakado et al.

(10) Patent No.: US 10,014,197 B2
(45) Date of Patent: Jul. 3, 2018

(54) SEMICONDUCTOR DEVICE MANUFACTURING METHOD

(71) Applicant: RENESAS ELECTRONICS CORPORATION, Tokyo (JP)

(72) Inventors: Sakae Terakado, Ibaraki (JP); Yohei Hamaguchi, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/704,810

(22) Filed: Sep. 14, 2017

(65) Prior Publication Data

US 2018/0082872 A1   Mar. 22, 2018

(30) Foreign Application Priority Data

Sep. 21, 2016   (JP) .................................. 2016-184123

(51) Int. Cl.
| | |
|---|---|
| *H01L 21/67* | (2006.01) |
| *H01L 21/768* | (2006.01) |
| *H01L 21/3105* | (2006.01) |
| *H01L 23/532* | (2006.01) |

(Continued)

(52) U.S. Cl.
CPC .. *H01L 21/67253* (2013.01); *H01L 21/31058* (2013.01); *H01L 21/32139* (2013.01); *H01L 21/76843* (2013.01); *H01L 21/76892* (2013.01); *H01L 21/76897* (2013.01); *H01L 23/535* (2013.01); *H01L 23/53266* (2013.01)

(58) Field of Classification Search
CPC ................................ H01L 21/00; H01L 23/00
See application file for complete search history.

(56) References Cited

U.S. PATENT DOCUMENTS

| | | | |
|---|---|---|---|
| 2005/0158982 A1* | 7/2005 | Kanamura | ........ H01L 21/76801 438/622 |
| 2007/0069384 A1* | 3/2007 | Watanabe | ........... H01L 23/5223 257/758 |

(Continued)

FOREIGN PATENT DOCUMENTS

| | | |
|---|---|---|
| JP | 05-67665 A | 3/1993 |
| JP | 07-50289 A | 2/1995 |

*Primary Examiner* — Caridad Everhart
*Assistant Examiner* — Ankush Singal
(74) *Attorney, Agent, or Firm* — McDermott Will & Emery LLP (57) ABSTRACT

The present invention provides a semiconductor device manufacturing method that can sense the atmospheric air leakage more precisely and that can prevent too many defective products from being manufactured.

The semiconductor device manufacturing method according to the embodiment includes the steps of: forming a barrier layer over an interlayer insulating film over a semiconductor substrate; forming a wiring layer over the barrier layer; forming a mask having an opening and configured by a photosensitive organic film over the wiring layer; patterning the wiring layer by etching the wiring layer through the opening; and removing the mask by a plasma processing using an ashing gas. The step of removing the mask includes the step of sensing an atmospheric air leakage that is mixture of the atmospheric air into the ashing gas by measuring an emission intensity of nitrogen in the ashing gas using an ultraviolet photometer.

7 Claims, 8 Drawing Sheets

(51) Int. Cl.
*H01L 21/3213* (2006.01)
*H01L 23/535* (2006.01)

(56) References Cited

U.S. PATENT DOCUMENTS

| | | | |
|---|---|---|---|
| 2008/0191311 A1* | 8/2008 | Wang | H01L 23/5223 257/532 |
| 2010/0233863 A1* | 9/2010 | Kawamura | H01L 21/76802 438/287 |
| 2012/0228774 A1* | 9/2012 | Furuhashi | H01L 21/76807 257/762 |
| 2013/0140554 A1* | 6/2013 | Yamazaki | H01L 29/786 257/43 |
| 2015/0364367 A1* | 12/2015 | Gambino | H01L 24/95 438/627 |

* cited by examiner

SEMICONDUCTOR DEVICE MANUFACTURING METHOD

CROSS-REFERENCE TO RELATED APPLICATIONS

The disclosure of Japanese Patent Application No. 2016-184123 filed on Sep. 21, 2016 including the specification, drawings and abstract is incorporated herein by reference in its entirety.

BACKGROUND

The present invention relates to a semiconductor device manufacturing method.

In a process of manufacturing the semiconductor device, a plasma processing is performed for etching and the like. The plasma processing needs to be performed in a vacuum environment. The plasma processing is therefore performed in a vacuum chamber.

However, even when it is performed in the vacuum chamber, atmospheric air containing nitrogen, oxygen, and the like may sometimes mix into (enter) the vacuum chamber due to an atmospheric air leakage. Such an atmospheric air leakage adversely affects the plasma processing.

As a method of sensing presence of such an atmospheric air leakage, there are known methods described in, for example, Japanese Unexamined Patent Application Publication Nos. Hei 5(1993)-67665 and Hei 7(1995)-50289. In the methods described in Japanese Unexamined Patent Application Publication Nos. Hei 5(1993)-67665 and Hei 7(1995)-50289, presence of the atmospheric air leakage is sensed by a spectroscope measuring an emission spectrum of nitrogen, oxygen, and the like.

SUMMARY OF THE INVENTION

The spectroscope disperses incident light using a diffraction grating (grating) and transmits the dispersed light through a slit, thereby detecting a light having a specific wavelength. That is, the light having a wavelength slightly different from the specific wavelength is shielded by the slit. Thus, the range of the wavelength detected using the spectroscope is extremely narrow.

Therefore, with the methods of detecting the atmospheric air leakage described in Japanese Unexamined Patent Application Publication Nos. Hei 5(1993)-67665 and Hei 7(1995)-50289, if an error occurs to the wavelength detected by the spectroscope due to aging or the like, it is not possible anymore to measure the emission spectrum of nitrogen, oxygen, and the like. As a result, in such a case of the error occurring to the wavelength detected by the spectroscope due to aging or the like, it is difficult to detect the atmospheric air leakage by the methods of detecting the atmospheric air leakage described in Japanese Unexamined Patent Application Publication Nos. Hei 5(1993)-67665 and Hei 7(1995)-50289.

Other problems and novel features will be apparent from description of the specification and accompanying drawings.

A semiconductor device manufacturing method according to an embodiment of the present invention includes the steps of: forming a barrier layer over an interlayer insulating film over a semiconductor substrate; forming a wiring layer over the barrier layer; forming a mask having an opening and configured by a photosensitive organic film over the wiring layer; patterning the wiring layer by etching the wiring layer through the opening; and removing the mask by a plasma processing using an ashing gas. The step of removing the mask includes the step of sensing an atmospheric air leakage that is mixture of the atmospheric air into the ashing gas by measuring an emission intensity of nitrogen in the ashing gas using an ultraviolet photometer.

A semiconductor manufacturing method according to an embodiment of the invention makes it possible to sense the atmospheric air leakage more precisely and prevent too many defective products from being manufactured.

DETAILED DESCRIPTION

Embodiments of the present invention will be described below with reference to drawings. It is noted that the same or corresponding elements are denoted by the same reference symbols. It is also noted that at least part of the embodiments described below may be combined as desired.

(Configuration of Semiconductor Device According to Embodiments)

Hereinbelow, a configuration of a semiconductor device according to an embodiment of the invention is described.

Figure 1:
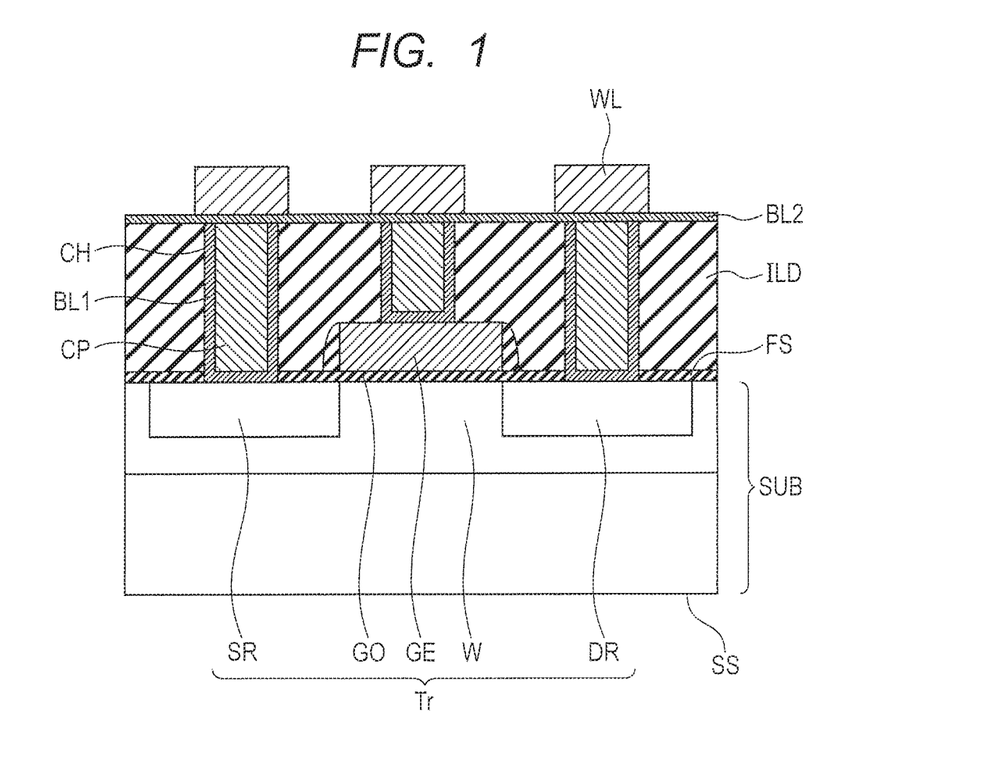
FIG. 1 is a cross-sectional view of a semiconductor device manufactured by a semiconductor device manufacturing method according to an embodiment of the present invention.

The semiconductor device according to the embodiment includes, as shown in FIG. 1, a semiconductor substrate SUB, a gate insulating film GO, a gate electrode GE, an interlayer insulating film ILD, a wiring layer WL, and a contact plug CP. The semiconductor device according to the embodiment further includes a first barrier layer BL1 and a second barrier layer BL2.

The semiconductor substrate SUB includes a first surface FS and a second surface SS. The second surface SS is a surface opposite from the first surface FS. The semiconductor substrate SUB is configured by, for example, silicon (Si). The semiconductor substrate SUB includes a well W formed over the first surface FS. The well W has a first conductivity type. The first conductivity type is, for example, a p-type.

The semiconductor substrate SUB includes a source region SR and a drain region DR over the first surface FS. The source region SR and the drain region DR have the second conductivity type. The second conductivity type is a conductivity type opposite from the first conductivity type. Specifically, when the first conductivity type is the p-type, the second conductivity type is an n-type. The well W has a portion sandwiched by the source region SR and the drain region DR over the first surface FS.

A gate insulating film GO is formed over the first surface FS where the well W is sandwiched by the source region SR and the drain region DR. The gate insulating film GO is formed by, for example, silicon dioxide ($SiO_2$). Formed over the gate insulating film GO is a gate electrode GE. The gate electrode GE is configured by, for example, polycrystalline Si. The source region SR, the drain region DR, the well W, the gate insulating film GO, and the gate electrode GE configure a transistor Tr.

The interlayer insulating film ILD is formed over the first surface FS of the semiconductor substrate SUB so as to cover the transistor Tr. The interlayer insulating film ILD is configured by, for example, $Si_2$.

Contact holes CH are formed in the interlayer insulating film ILD. The contact holes CH are formed over the source region SR, the drain region DR, and the gate electrode GE. The contact holes CH penetrate the interlayer insulating film ILD.

A contact plug CP is formed in each contact hole CH. The contact plug CP is electrically coupled to the source region SR, the drain region DR, and the gate electrode GE. The contact plug CP is configured by, for example, tungsten (W).

The first barrier layer BL1 is formed between an inner wall of the contact hole CH and the contact plug CP, between the source region SR and the contact plug CP, and between the drain region DR and the contact plug CP. The first barrier layer BL1 is configured by, for example, a titanium (Ti) layer containing the inner wall of the contact hole CH, the source region SR, the drain region DR, and nitrogen (N) formed over the drain region DR, and a titanium nitride (TiN) layer formed over the Ti layer containing N.

The second barrier layer BL2 is formed over the interlayer insulating film ILD and the contact plug CP. The second barrier layer BL2 preferably includes a Ti layer containing substantially no N. More specifically, the second barrier layer BL2 is configured by the Ti layer containing substantially no N formed over the interlayer insulating film ILD and the contact plug CP, and the TiN layer formed over the Ti layer containing substantially no N.

In this case, the Ti layer containing substantially no N is not direct contact with the wiring layer WL to be described later. Thus, the Ti layer containing substantially no N remains in between with the wiring layer WL without being alloyed.

The expression that Ti contains substantially no N means herein that the concentration of N in Ti is 3 atomic percent or less.

The wiring layer WL is formed over the second barrier layer BL2. The wiring layer WL contains, for example, aluminum (Al) as a main material with a few percent of silicon (Si) and copper (Cu) added thereto as needed. The wiring layer WL is electrically coupled to the contact plug CP. Thus, the wiring layer WL is electrically coupled to the source region SR, the drain region DR, and the gate electrode GE.

Although the description is given above for the case of a single wiring layer, the number of wiring layers is not limited thereto. For example, there may be two or more wiring layers.

(Configuration of Method of Manufacturing a Semiconductor Device According to the Embodiment)

A configuration of a method of manufacturing a semiconductor according to the embodiment is described below.

Figure 2:
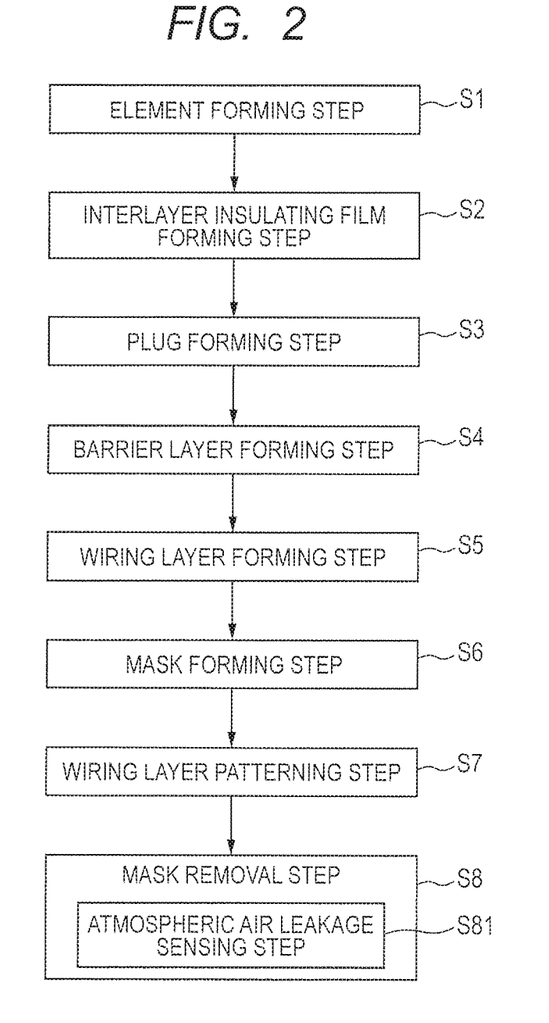
FIG. 2 is a process chart of the semiconductor device manufacturing method according to an embodiment.

As shown in FIG. 2, the semiconductor device manufacturing method includes an element forming step S1, an interlayer insulating film forming step S2, a plug forming step S3, a barrier layer forming step S4, a wiring layer forming step S5, a mask forming step S6, a wiring layer patterning step S7, and a mask removal step S8. The mask removal step S8 includes an atmospheric air leakage sensing step S81.

Figure 3:
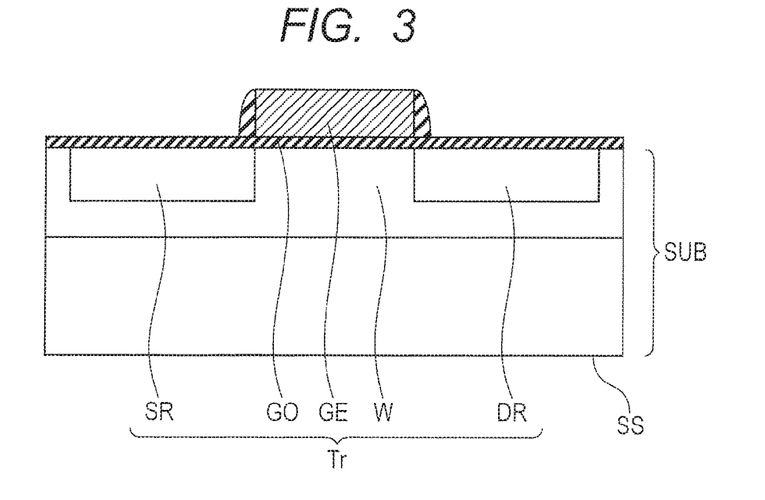
FIG. 3 is a cross-sectional view of the semiconductor device after completion of an element forming step and before an interlayer insulating film forming step is performed.

As shown in FIG. 3, the transistor Tr is formed at the element forming step S1. The formation of the transistor Tr is performed using an existing method. For example, the source region SR, the drain region DR, and the well W are formed by the ion implantation technique. The gate insulating film GO is formed by, for example, thermal oxidation. Furthermore, the gate electrode GE is formed by, for example, patterning using CVD film formation, photolithography, and etching.

Figure 4:
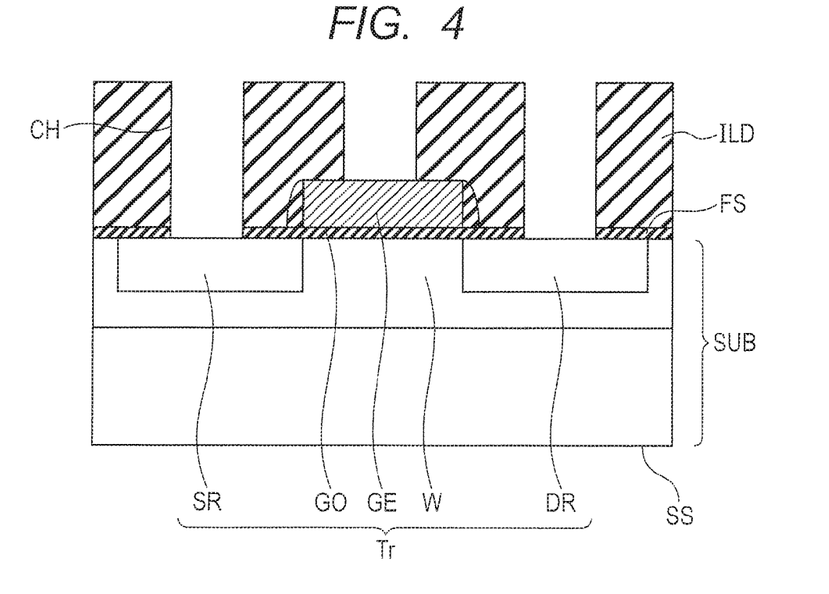
FIG. 4 is a cross-sectional view of the semiconductor device after completion of the interlayer insulating film forming step and before a contact plug forming step is performed.

As shown in FIG. 4, the interlayer insulating film ILD is formed at the interlayer insulating film forming step S2. Furthermore, the contact hole CH is formed in the interlayer insulating film ILD at the interlayer insulating film forming step S2. The interlayer insulating film ILD and the contact hole CH are formed using an existing method. For example, the interlayer insulating film ILD may be formed by the CVD (Chemical Vapor Deposition). The contact hole CH may be formed by, for example, anisotropic etching such as RIE (Reactive Ion Etching).

Figure 5:
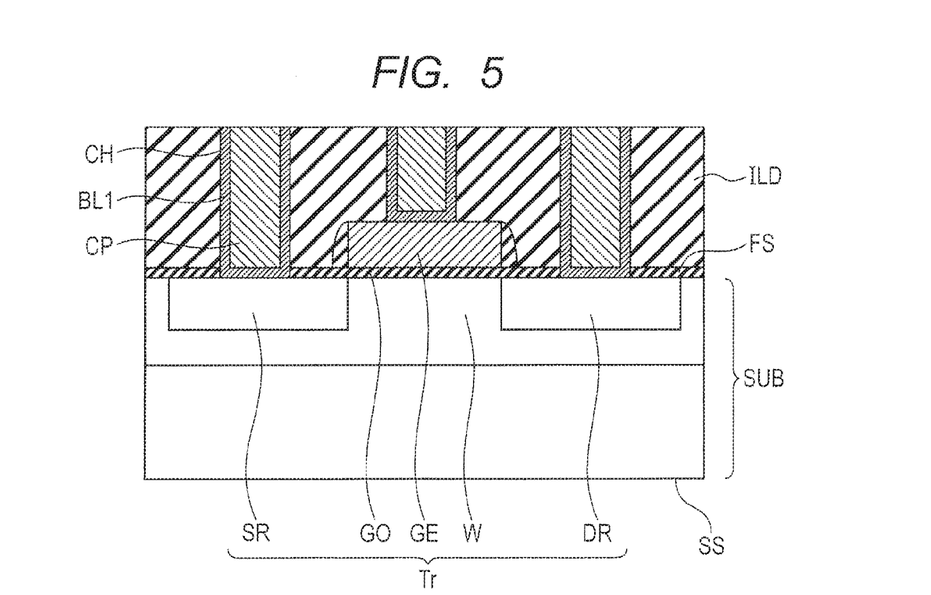
FIG. 5 is a cross-sectional view of the semiconductor device after completion of the contact plug forming step and before a barrier layer forming step is performed.

As shown in FIG. 5, the first barrier layer BL1 is formed at the plug forming step S3. The contact plug CP is also formed at the plug forming step S3. The first barrier layer BL1 and the contact plug CP are formed using an existing method. For example, the first barrier layer BL1 may be formed by the sputtering. Furthermore, the contact plug CP may be formed by, for example, the CVD.

Figure 6:
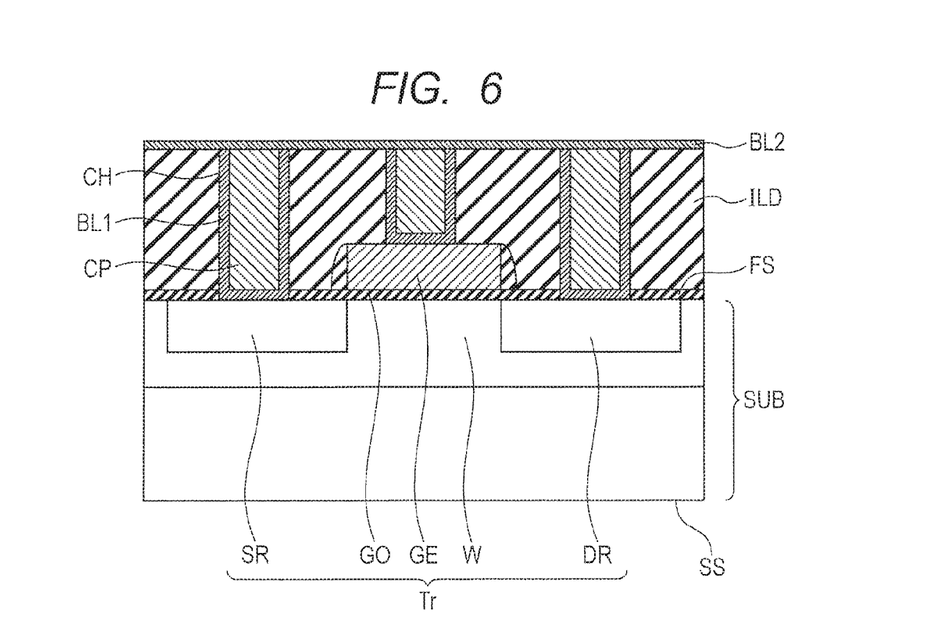
FIG. 6 is a cross-sectional view of the semiconductor device after completion of the barrier layer forming step and before a wiring layer forming step is performed.

As shown in FIG. 6, the second barrier layer BL2 is formed at the barrier layer forming step S4. The second barrier layer BL2 is formed using an existing method. The second barrier layer BL2 may be formed by, for example, the sputtering.

Figure 7:
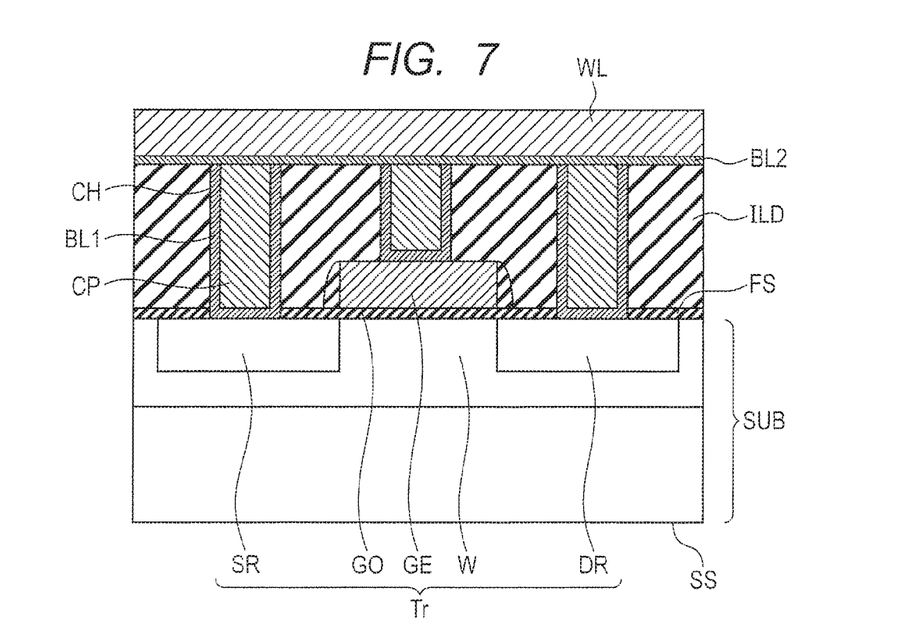
FIG. 7 is a cross-sectional view of the semiconductor device after completion of the wiring layer forming step and before a mask forming step is performed.

As shown in FIG. 7, the wiring layer WL is formed all over the second barrier layer BL2 at the wiring layer forming step S5. The wiring layer WL is formed using an existing method. For example, the wiring layer WL may be formed by the sputtering.

Figure 8:
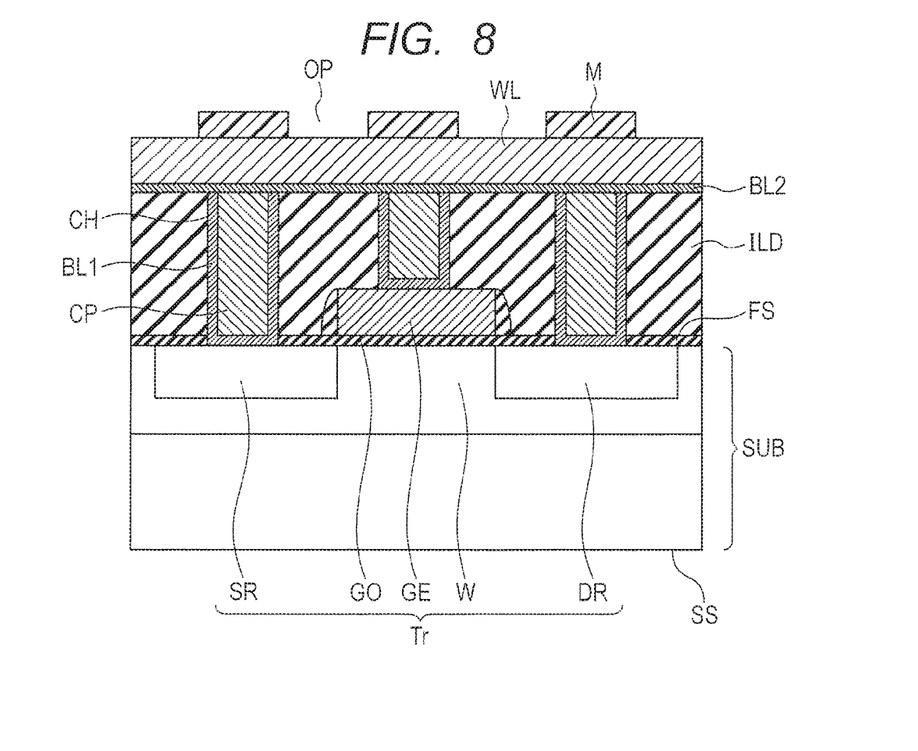
FIG. 8 is a cross-sectional view of the semiconductor device after completion of the mask forming step and before a wiring layer patterning step is performed.

As shown in FIG. 8, a mask M is formed at the mask forming step S6. The mask M has an opening OP. The mask M may be, for example, a photosensitive organic film such as a photoresist. The mask M having an opening OP is formed using an existing method. For example, the mask M having an opening OP may be formed by spin coating and photolithography.

Figure 9:
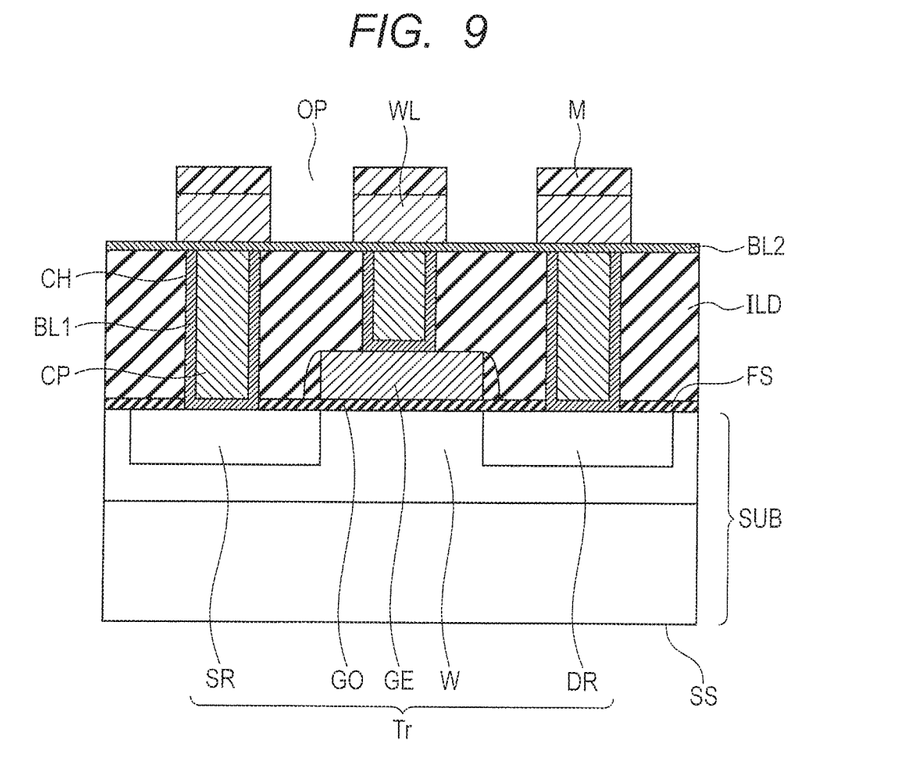
FIG. 9 is a cross-sectional view of the semiconductor device after completion of the wiring layer patterning step and before a mask removal step is performed.

As shown in FIG. 9, the patterned wiring layer WL is formed at the wiring layer patterning step S7. The wiring layer WL is patterned using an existing method. That is, the wiring layer WL is patterned by etching the wiring layer WL via the opening OP of the mask M.

Figure 10:
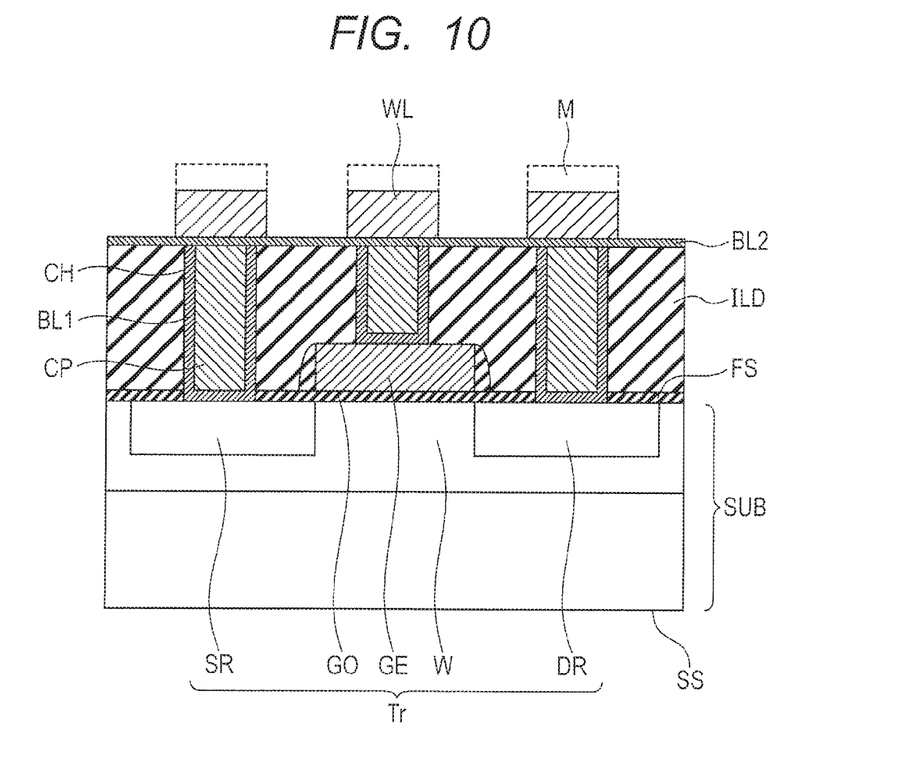
FIG. 10 is a cross-sectional view of the semiconductor device after completion of the mask removal step.

As shown in FIG. 10, the mask M is removed by the plasma processing using ashing gas AG at the mask removal step S8. At the atmospheric air leakage sensing step S81, the atmospheric air leakage is sensed by measuring the emission spectrum of nitrogen in the ashing gas AG using an ultraviolet photometer UV.

Figure 11:
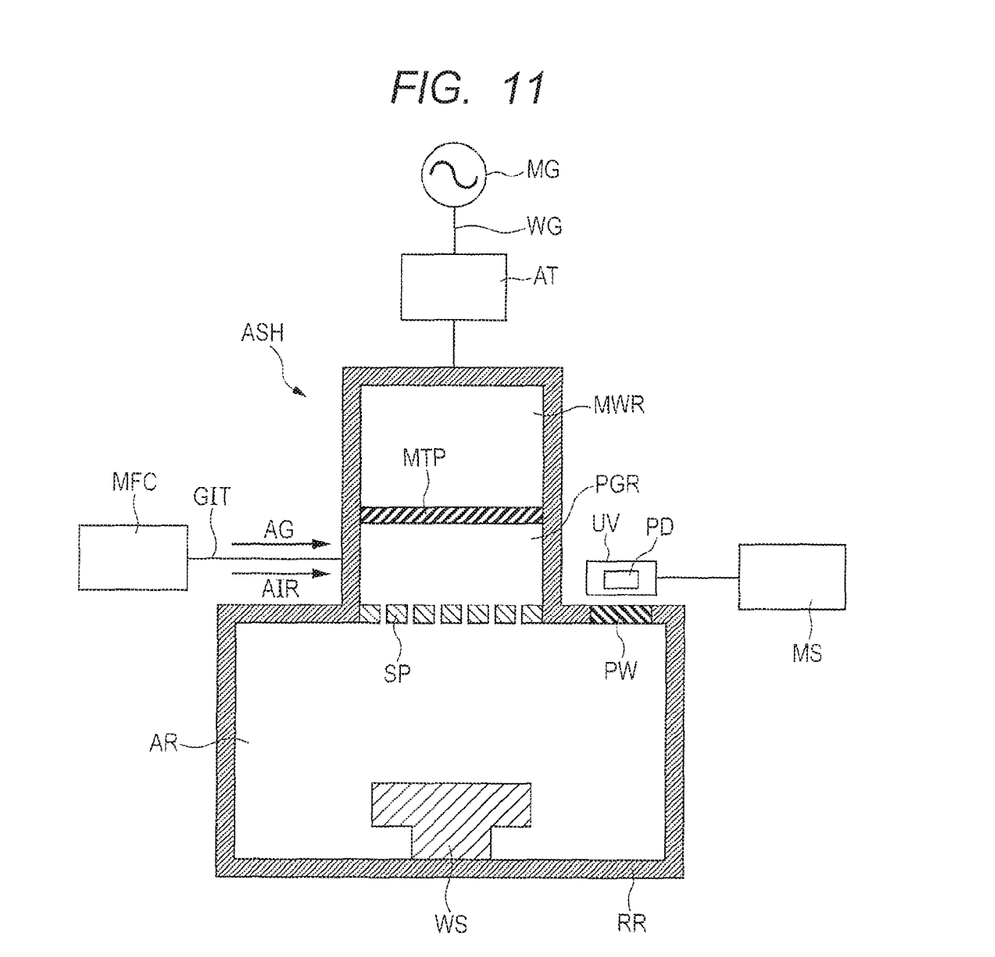
FIG. 11 is a schematic view of an ashing device used in the mask removal step.

As shown in FIG. 11, an ashing device ASH includes a reaction chamber PR, a waveguide WG, a magnetron MG, and a mass flow controller MFC. The inside of the reaction chamber PR is a vacuum environment. The reaction chamber PR includes a microwave introducing chamber MWR, a plasma generating chamber PGR, and an ashing chamber AR.

The microwave introducing chamber MWR is coupled to the waveguide WG. Coupled to the waveguide WG is the magnetron MG. An auto-tuner AT is arranged on a path of the waveguide WG. The microwave introducing chamber MWR and the plasma generating chamber PGR are separated by a microwave transmission plate MTP. The microwave transmission plate MTP is configured by, for example, quartz glass. The microwave introducing chamber MWR and the ashing chamber AR are separated by a shower plate SP. The shower plate SP has a lot of pores formed therein.

The plasma generating chamber PGR is provided with a reaction gas inlet (not shown). The reaction gas inlet is coupled to the mass flow controller via a gas introducing tube GIT. The ashing chamber AR is provided with a wafer stage WS. Placed over the wafer stage WS is the semiconductor device having been subjected to the wiring layer patterning step S7.

The magnetron MG generates a microwave. The microwave generated by the magnetron MG is introduced into the microwave introducing chamber MWR via the waveguide WG. The microwave introduced into the microwave introducing chamber MWR transmits through the microwave transmission plate MTP and reaches the plasma generating chamber PGR.

Ashing gas AG is provided to the plasma generating chamber PGR via the gas introducing tube GIT and the reaction gas inlet. The ashing gas AG contains oxygen ($O_2$). The ashing gas AG preferably contains tetrafluoromethane ($CF_4$) and water ($H_2O$).

The microwave arrived at the plasma generating chamber PGR excites the ashing gas AG provided to the plasma generating chamber PGR. As a result, the ashing gas AG is plasmatized. Atmospheric air AIR may be sometimes mixed into the ashing gas AG via the mass flow controller MFC (the mixture of the atmospheric air AIR into the ashing gas AG is referred to as atmospheric air leakage).

When the atmospheric air leakage occurs, nitrogen ($N_2$) contained in the atmospheric air AIR is plasmatized by the microwave arrived at the plasma generating chamber PGR. Furthermore, in addition to N2, the atmospheric air AIR contains nitrogen monoxide (NO), ammonia ($NH_3$), carbon dioxide ($CO_2$), and the like. Thus, when the atmospheric air leakage occurs, they are also plasmatized by the microwave arrived at the plasma generating chamber PGR.

The plasmatized ashing gas AG is introduced into the ashing chamber AR through the pores formed in the shower plate SP. The ashing gas AG introduced into the ashing chamber AR reacts with the mask M of the semiconductor device placed over the wafer stage WS. The mask M is removed by this reaction.

The plasmatized atmospheric air AIR is also introduced into the ashing chamber AR through the pores formed in the shower plate SP. Components of the atmospheric air AIR introduced into the ashing chamber AR reacts with the second barrier layer BL2. The second barrier layer BL2 is eroded by this reaction.

The ashing chamber AR includes an inspection window PW. The ultraviolet photometer UV is attached to the inspection window PW. The ultraviolet photometer UV has an ability to detect an ultraviolet. Unlike the spectroscope, the ultraviolet photometer UV has the ability to detect not only the ultraviolet of a specific wavelength but also the ultraviolet within a certain wavelength range.

More specifically, the ultraviolet photometer UV includes a photodiode PD having the ability to detect an ultraviolet as an ultraviolet detector. The photodiode PD detects the ultraviolet by sensing an electric current generated by photoelectric conversion by the incident ultraviolet. The photodiode PD can perform the photoelectric conversion not only with the ultraviolet of a specific wavelength but also with the ultraviolet within a certain wavelength range. Thus, unlike the spectroscope, the ultraviolet photometer UV is capable of detecting not only the ultraviolet of a specific wavelength but also the ultraviolet within a certain wavelength range.

The ultraviolet photometer UV is capable of detecting the wavelength between 346 nm and 366 nm. More specifically, the ultraviolet photometer UV is capable of detecting the wavelength between 336 nm and 376 nm. Even more specifically, the ultraviolet photometer UV is capable of detecting the wavelength between 300 nm and 410 nm.

Preferably the ultraviolet photometer UV has a flat sensitivity in the detectable wavelength range. Having a flat sensitivity herein means that the responded output has low wavelength dependence.

The emission wavelength of the plasmatized $N_2$ is 356 nm. This makes it possible to sense the fact that the atmospheric air leakage occurs in the reaction chamber PR by sensing an emission spectrum of the plasmatized $N_2$ using the ultraviolet photometer UV.

It is noted that the emission wavelengths of the plasmatized NO, $NH_3$, and $CO_2$ are in a range of 300 nm to 410 nm. Thus, when the ultraviolet photometer UV is capable of detecting the wavelength between 300 nm and 410 nm, the ultraviolet photometer UV can detect the atmospheric air leakage by sensing the emission spectra of NO, $NH_3$, and $CO_2$.

It should be noted that the ultraviolet photometer UV outputs a signal corresponding to the emission spectrum of the detected $N_2$ or the like to a monitoring system MS.

The ultraviolet photometer UV is coupled to the monitoring system MS. The monitoring system MS calculates an index value of the atmospheric air leakage based on the signal from the ultraviolet photometer UV. Moreover, the monitoring system MS compares the calculated index value of the atmospheric air leakage with a predetermined threshold. The atmospheric air leakage may be detected by comparing the index value with the predetermined threshold.

The monitoring system MS may calculate a maximum value of the emission intensity of $N_2$ or the like measured by the ultraviolet photometer UV with respect to each semiconductor substrate SUB as the index value of the atmospheric air leakage. The monitoring system may calculate a time integration value of the emission intensity of $N_2$ or the like measured by the ultraviolet photometer UV with respect to each semiconductor substrate SUB as the index value of the atmospheric air leakage.

The monitoring system MS may calculate a maximum value of the emission intensity of $N_2$ or the like measured by the ultraviolet photometer UV with respect to each processing lot of the semiconductor substrates SUB as the index value of the atmospheric air leakage. The monitoring system may calculate a time integration value of the emission intensity of $N_2$ or the like measured by the ultraviolet photometer UV with respect to each processing lot of the semiconductor substrates SUB as the index value of the atmospheric air leakage.

The description is given above for the case of sensing the atmospheric air leakage when the mask M is removed by the plasma processing using the ashing gas AG. However, the method of sensing the atmospheric air leakage described above can also be applied to sensing the atmospheric air leakage in other plasma processing than ashing. For example, the method of sensing the atmospheric air leakage described above can be applied to sensing the atmospheric air leakage in the case of film forming and etching on an insulating layer (interlayer insulating film, passivation film, and the like), a conductive layer (wiring layer, silicide layer, and the like), or a semiconductor layer (polycrystalline Si, monocrystalline Si, and the like) using the plasma processing.

The description is given above for the case of a single wiring layer WL. When there are a plurality of wiring layers WL, it is possible to manufacture a semiconductor device including multiple wiring layers WL by repeating the interlayer insulating film forming step S2, the plug forming step S3, the barrier layer forming step S4, the wiring layer forming step S5, the mask forming step S6, the wiring layer patterning step S7, and the mask removal step S8.

(Effect of Semiconductor Device According to the Embodiment)

Hereinbelow, the effect of the semiconductor device manufacturing method according to the above embodiment is described in comparison with the case of sensing the atmospheric air leakage using the spectroscope.

As described above, when sensing the atmospheric air leakage using the spectroscope, the sensed wavelength may be shifted due to aging or the like of the spectroscope. Thus, sensing of the atmospheric air leakage using the spectroscope is not reliable.

When the atmospheric air leakage occurs, components of the plasmatized atmospheric air AIR may erode the second barrier layer BL2. It is difficult to sense such an erosion of the second barrier layer BL2 by visual inspection. Such an erosion of the second barrier layer BL2 can be sensed by cross-sectional observation of the semiconductor device. However, it is difficult to incorporate the cross-sectional observation in the manufacturing process.

Moreover, such an erosion of the second barrier layer occurs may cause an interfacial delamination between the wiring layer WL and the contact plug CP. As a result, a resistance value between the wiring layer WL and the contact plug CP increases. Thus, the erosion of the second barrier layer BL2 can be sensed by a resistance value measurement. However, such a resistance value measurement is performed after completion of the manufacturing process. Thus, when sensing the atmospheric air leakage by the resistance value measurement, there is a risk of manufacturing many defective products without knowing the presence of the atmospheric air leakage.

On the other hand, the semiconductor device manufacturing method according to the embodiment uses the ultraviolet photometer UV. The ultraviolet photometer UV can detect the ultraviolet within a certain wavelength range. Therefore, in the semiconductor device manufacturing method according to the embodiment, it hardly becomes difficult to sense atmospheric air leakage due to aging or the like. Thus, the semiconductor device manufacturing method according to the embodiment makes it possible to sense the atmospheric air leakage more precisely. As a result, it is possible to stop manufacturing as soon as the atmospheric air leakage is sensed, thereby preventing too many defective products from being manufactured.

When the ashing gas AG contains $CF_4$, $O_2$, and $H_2O$, highly reactive fluorine (F) radical is generated in the case of the atmospheric air leakage. That is, when the ashing gas AG contains $CF_4$, $O_2$, and $H_2O$, there is a high possibility to manufacture many defective products unless the atmospheric air leakage is sensed appropriately. The semiconductor device manufacturing method according to the embodiment can prevent too many defective products from being manufactured even when a highly reactive material is generated as a result of the atmospheric air leakage.

The Ti layer containing substantially no N is more easily eroded by the F radical. Therefore, when the second barrier layer BL2 includes the Ti layer containing substantially no N, there is a high possibility to manufacture many defective products unless the atmospheric air leakage is sensed appropriately. The semiconductor device manufacturing method according to the embodiment can prevent too many defective products from being manufactured even when using a highly erosive material is used as the second barrier layer BL2.

In the semiconductor device manufacturing method according to the embodiment, when the ultraviolet photometer UV is capable of detecting the wavelength between 346 nm and 366 nm or capable of detecting the wavelength between 336 nm and 376 nm, the possibility of not sensing the atmospheric air leakage is further reduced. Thus, in this case, it is possible to prevent many defective products from being manufactured more definitely.

In the semiconductor device manufacturing method according to the embodiment, when the ultraviolet photometer W is capable of detecting the wavelength between 300 nm and 410 nm, the emission spectra of NO, $NH_3$, and $CO_2$ contained in the atmospheric air can be used for sensing the atmospheric air leakage. Thus, in this case, it is made possible to sense the atmospheric air leakage more precisely and possible to prevent many defective products from being manufactured more definitely.

From the view point of preventing defective products from being manufactured as much as possible, it is preferable that the atmospheric air leakage is sensed strictly. On the other hand, to sense the atmospheric air leakage strictly, those beyond acceptable quality should be determined to be defective. That is, the production yield is reduced. In the semiconductor device manufacturing method according to the embodiment, based on the emission intensity of $N_2$ in the ashing gas AG measured by the ultraviolet photometer UV, when sensing the atmospheric air leakage by calculating the maximum value of the emission intensity with respect to each processing lot or with respect to each semiconductor substrate or the time integration value of the emission intensity with respect to each processing lot or with respect to each semiconductor substrate as the index value of the atmospheric air leakage and comparing the index value with the predetermined value, it is possible to sense the atmospheric air leakage appropriately in association with the acceptable quality and production yield.

While the invention made by the inventors was specifically described above based on the embodiment, it is needless to say that the invention is not limited to the embodiment but various modifications can be made without departing from the scope of the invention.

What is claimed is:

1. A semiconductor device manufacturing method comprising the steps of:
    forming a barrier layer over an interlayer insulating film over a semiconductor substrate;
    forming a wiring layer over the barrier layer;
    forming a mask having an opening and configured by a photosensitive organic film;
    patterning the wiring layer by etching the wiring layer through the opening; and
    removing the mask by a plasma processing using an ashing gas,
    wherein the step of removing the mask comprises a step of sensing an atmospheric air leakage that is mixture of the atmospheric air into the ashing gas by measuring an emission spectrum of nitrogen in the ashing gas using an ultraviolet photometer.

2. The semiconductor device manufacturing method according to claim 1,
    wherein the ashing gas contains tetrafluoromethane, oxygen, and water.

3. The semiconductor device manufacturing method according to claim 2,
    wherein the barrier layer comprises a titanium layer containing substantially no nitrogen.

4. The semiconductor device manufacturing method according to claim 1,
    wherein the ultraviolet photometer is capable of detecting an ultraviolet within a wavelength range between 336 nm and 376 nm.

5. The semiconductor device manufacturing method according to claim 1,
    wherein the ultraviolet photometer is capable of detecting an ultraviolet within a wavelength range between 300 nm and 410 nm.

6. The semiconductor device manufacturing method according to claim 1,
    wherein, at the step of sensing the atmospheric air leakage, the atmospheric air leakage is sensed by calculating an index value from an intensity of the emission spectrum and comparing the index value with a predetermined threshold, and
    wherein the index value is a maximum value of the intensity with respect to each processing lot.

7. The semiconductor device manufacturing method according to claim 1,
    wherein, at the step of sensing the atmospheric air leakage, the atmospheric air leakage is sensed by calculating an index value from an intensity of the emission spectrum and comparing the index value with a predetermined threshold, and
    wherein the index value is a time integration value of the intensity with respect to each processing lot.

* * * * *